US010438116B2

United States Patent
Oh et al.

(10) Patent No.: US 10,438,116 B2
(45) Date of Patent: Oct. 8, 2019

(54) NEUROMORPHIC ARITHMETIC DEVICE (71) Applicant: ELECTRONICS AND TELECOMMUNICATIONS RESEARCH INSTITUTE, Daejeon (KR)

(72) Inventors: Kwang IL Oh, Daejeon (KR); Sung Eun Kim, Daejeon (KR); Seong Mo Park, Daejeon (KR); Hyung-IL Park, Daejeon (KR); Jae-Jin Lee, Daejeon (KR); Joo Hyun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 5 days.

(21) Appl. No.: 15/804,912

(22) Filed: Nov. 6, 2017

(65) Prior Publication Data
US 2018/0232635 A1 Aug. 16, 2018

(30) Foreign Application Priority Data

Feb. 10, 2017 (KR) .................. 10-2017-0018852
Jul. 7, 2017 (KR) .................. 10-2017-0086666

(51) Int. Cl.
*G06N 3/063* (2006.01)
*G06F 5/01* (2006.01)
(Continued)

(52) U.S. Cl.
CPC ............ *G06N 3/0635* (2013.01); *G06F 5/01* (2013.01); *G06F 7/68* (2013.01); *H03K 19/20* (2013.01)

(58) Field of Classification Search
CPC .............................. G06N 3/049; G06N 3/0635
See application file for complete search history.

(56) References Cited

U.S. PATENT DOCUMENTS 5,343,555 A * 8/1994 Yayla .................. G06N 3/0675
706/35
9,053,428 B2 6/2015 Hunzinger et al.
(Continued)

FOREIGN PATENT DOCUMENTS

KR 10-1512370 B1 4/2015
KR 10-1596656 B1 2/2016
(Continued)

OTHER PUBLICATIONS

Over M. Nagata et al., PWM Signal Processing Architecture for Intelligent Systems, Computers Elect. Engng vol. 23, No. 6, pp. 393-405, 1997 (Year: 1997).*
(Continued)

*Primary Examiner* — Matthew D Sandifer
*Assistant Examiner* — Emily E Larocque (57) ABSTRACT

The present disclosure relates to a neuromorphic arithmetic device. The neuromorphic arithmetic device may include first and second synapse circuits, a charging/discharging circuit, a comparator, and a counter. The first synapse circuit may generate a first current by performing a first multiplication operation on a first PWM signal and a first weight, and the second synapse circuit may generate a second current by performing a second multiplication operation on a second PWM signal and a second weight. The charging/discharging circuit may store charges induced by the first current and the second current in a charging period, and may discharge the charges in a discharging period. The comparator may compare a voltage level of the charges discharged in the discharging period and a level of a reference voltage. The counter may count output pulses of an oscillator on the basis of a result of the comparison by the comparator.

12 Claims, 7 Drawing Sheets

(51) Int. Cl.
  *G06F 7/68* (2006.01)
  *H03K 19/20* (2006.01)

(56) References Cited

U.S. PATENT DOCUMENTS

| | | |
|---|---|---|
| 9,142,025 B2 | 9/2015 | Park et al. |
| 2006/0271342 A1* | 11/2006 | Farhat .................. G06N 3/0635 703/2 |
| 2013/0089254 A1 | 4/2013 | Kim et al. |

FOREIGN PATENT DOCUMENTS

| | | | |
|---|---|---|---|
| WO | WO-2006113295 A1 * | 10/2006 | ............. G01S 7/483 |
| WO | WO 2015/108293 A1 | 7/2015 | |

OTHER PUBLICATIONS

Analog Devices, Application Note AN-849, Rev. A, 2011 (Year: 2011).*
Iwata et al., A Concept of Analog-Digital Merged Circuit Architecture for Future VLSI's, Analog Integrated Circuits and Signal Processing, 11, pp. 83-96, 1996 (Year: 1996).*
K. Papathanasiou, et al., Palmo: Pulse-Based Signal Processing for Prgrammable Analog VLSI, IEEE Transactions on Circuits and Systems, II: Analog and Digital Signal Processing, vol. 49, No. 6, 2002, pp. 379-389 (Year: 2002).*
S. Sung, Bio-Inspired Collective Analog Computation, Massachusetts Institute of Technology, Master of Science in Electrical Engineering and Computer Science Thesis, 2012. (Year: 2012).*

\* cited by examiner

NEUROMORPHIC ARITHMETIC DEVICE

CROSS-REFERENCE TO RELATED APPLICATIONS

This U.S. non-provisional patent application claims priority under 35 U.S.C. § 119 of Korean Patent Application Nos. 10-2017-0018852, filed on Feb. 10, 2017, and 10-2017-0086666, filed on Jul. 7, 2017, the entire contents of which are hereby incorporated by reference.

BACKGROUND

The present disclosure herein relates to a neuromorphic arithmetic device, and more particularly to, a neuromorphic arithmetic device implemented in an analog manner.

A neuromorphic arithmetic device represents a device which mimics the human nervous system or brain to process information. Unlike a structure in which an arithmetic unit, an instruction processor, and a storage unit are independently present and on which a typical computer central processing unit is based, the neuromorphic arithmetic device may process information in parallel. Even while processing information, the neuromorphic arithmetic device may process information with a focus on a newly occurring event.

The neuromorphic arithmetic device may be defined by a two-dimensional or three-dimensional connection of a plurality of neurons. Each neuron may be configured with circuits corresponding to axon, dendrite, and soma in the same manner as constituent elements of a biological neuron. In particular, an arithmetic operation is performed in a synapse circuit connecting neurons.

The role of a synapse circuit (arithmetic unit) is very important to process, quickly and in parallel, information input to the neuromorphic arithmetic device. To quickly process massive data, a typical neuromorphic arithmetic device is provided with an arithmetic unit implemented in a digital manner. According to this configuration, as the amount of data to be processed increases, power consumption and a chip area increase. Therefore, extension of a circuit is limited in an application field in which power consumption is an issue.

In general, in a synapse of an analog neuromorphic arithmetic device, a capacitance of a metal line generated to implement a dendrite is used. Here, addition and multiplication operations are performed by directly charging or discharging a corresponding node by operating an oscillator. However, according to operations performed in this manner, since a metal line having a very high capacitance is directly charged or discharged using an oscillator, the amount of wasted charges is very large when an operating frequency is high, and thus power consumption increases. Furthermore, as the number of synapse circuits increases, the capacitance of a metal line increases, and thus the size of a current source of a synapse is required to be increased to generate the same frequency.

SUMMARY

The present disclosure provides a neuromorphic arithmetic device for converting a result of an operation performed in an analog manner into a digital value to output the digital value.

An embodiment of the inventive concept provides a neuromorphic arithmetic device including: a first synapse circuit configured to generate a first current by performing a first multiplication operation on a first pulse width modulation (PWM) signal and a first weight; a second synapse circuit configured to generate a second current by performing a second multiplication operation on a second PWM signal and a second weight; a charging/discharging circuit configured to store charges induced by the first current and the second current in a charging period, and discharge the charges in a discharging period; a comparator configured to compare a voltage level of the charges discharged in the discharging period and a level of a reference voltage; and a counter configured to count output pulses of an oscillator on the basis of a result of the comparison by the comparator.

In an embodiment, the neuromorphic arithmetic device may further include: a first PWM converter configured to convert a first input into the first PWM signal; and a second PWM converter configured to convert a second input into the second PWM signal.

In an embodiment, the first synapse circuit may include a first AND gate configured to perform an AND operation on the first PWM signal and the first weight, and a first charging current source configured to generate the first current according to an output from the first AND gate, and the second synapse circuit may include a second AND gate configured to perform an AND operation on the second PWM signal and the second weight, and a second charging current source configured to generate the second current according to an output from the second AND gate. Furthermore, the first charging current may be configured so that a voltage level of the charging/discharging circuit induced by the first current increases linearly, and the second charging current may be configured so that a voltage level of the charging/discharging circuit induced by the second current increases linearly.

In an embodiment, the charging/discharging circuit may include: a capacitor configured to store the charges in the charging period; and a discharging current source configured to linearly decrease a voltage level of the capacitor induced by the charges in the discharging period.

In an embodiment, the comparator may output an enable signal which is activated in a period during which the voltage level of the discharged charges is higher than the reference voltage. Furthermore, the comparator may be a differential amplifier operating in a period during which the charging/discharging circuit is discharged. Furthermore, the counter may count the output pulses of the oscillator in a period during which the enable signal is activated. In addition, the neuromorphic arithmetic device may further include a switch configured to be switched on in response to activation of the enable signal to connect the oscillator to the counter.

In an embodiment, the neuromorphic arithmetic device may further include a level shifter configured to shift a digital value output from the counter.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Exemplary embodiments of the inventive concept will be described in detail with reference to the accompanying drawings. In the following description, specific details such as configurations and structures are provided only to assist with an understanding of embodiments of the inventive concept. Therefore, those skilled in the art could make modifications of the embodiments of the inventive concept described herein without departing from the technical spirit and scope of the inventive concept. Descriptions of well-known functions and structures are not provided for clarity and conciseness. The terms used herein are defined in consideration of the functions of the embodiments of the inventive concept, and are not limited to specific functions. The terms may be defined based on the detailed description.

The modules illustrated in the drawings or described herein may be connected to elements other than the constituent elements illustrated in the drawings or described herein. A connection between modules or constituent elements may be direct or indirect. A connection between modules or constituent elements may be established through communication or may be a physical contact.

Constituent elements described using the terms "part", "unit", "module", "layer", etc. used herein may be implemented as hardware, software, or a combination thereof. For example, the software may be a machine code, firmware, an embedded code, or application software. For example, the hardware may include an electric circuit, an electronic circuit, a processor, a computer, an integrated circuit, integrated circuit cores, a pressure sensor, an inertial sensor, a micro electro mechanical system (MEMS), a passive element, or combinations thereof.

The terms used herein, including technical or scientific terms, have meanings that can be understood by those skilled in the art. The terms generally defined in a dictionary may be interpreted as having the same meanings as contextual meanings defined in the related art, and should not be interpreted in an idealized or overly formal sense unless otherwise defined explicitly.

Figure 1:
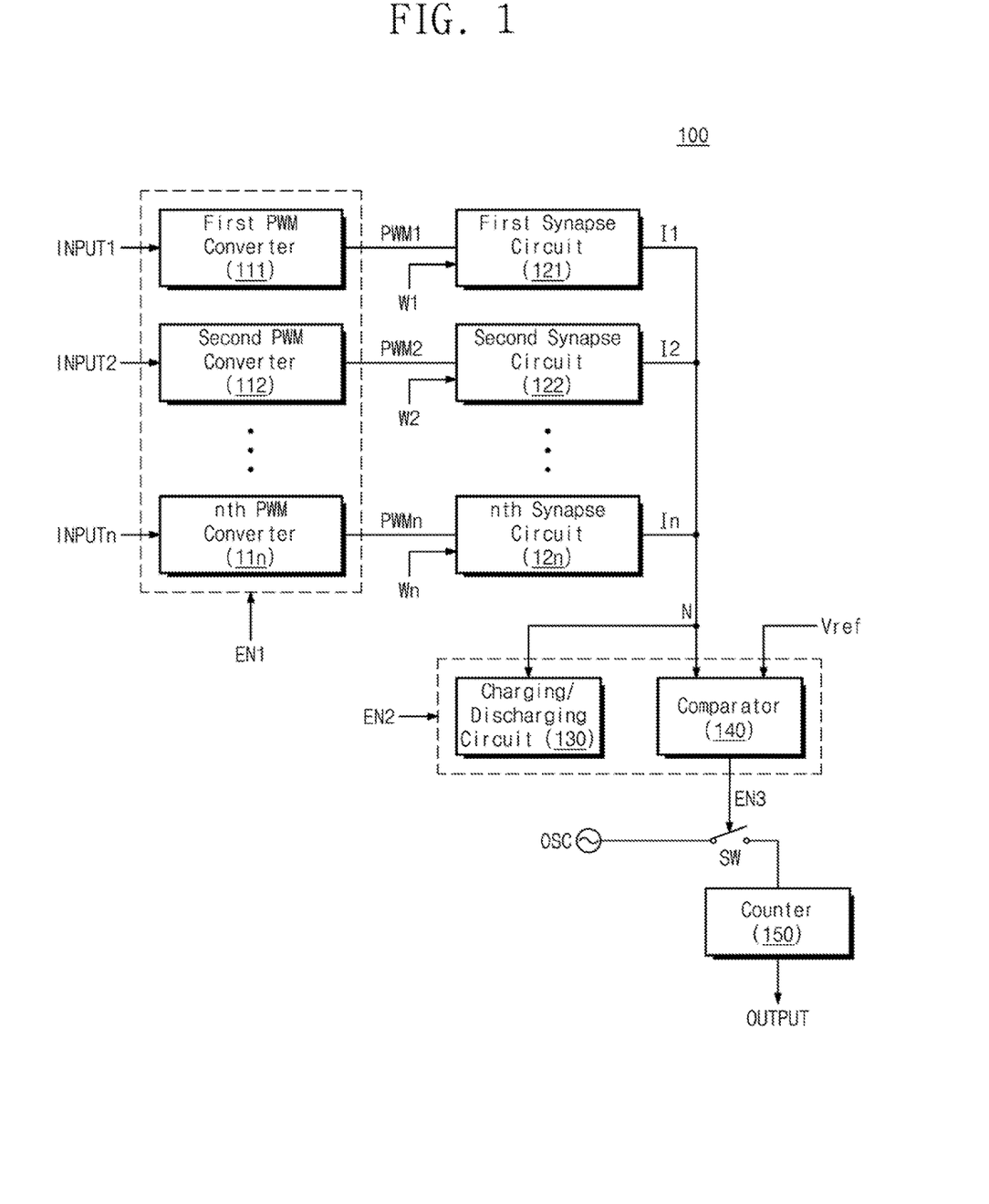
FIG. 1 is a block diagram illustrating a neuromorphic arithmetic device according to an embodiment of the inventive concept.

FIG. 1 is a block diagram illustrating a neuromorphic arithmetic device according to an embodiment of the inventive concept. A neuromorphic arithmetic device 100 may include a plurality of pulse width modulation (PWM) converters 111 to 11$n$, a plurality of synapse circuits 121 to 12$n$, a charging/discharging circuit 130, a comparator 140, and a counter 150.

The neuromorphic arithmetic device 100 may be configured to perform a plurality of multiplication operations on a plurality of multipliers and a plurality of multiplicands. For example, the synapse circuits 121 to 12$n$ provided to the neuromorphic arithmetic device 100 may operate as a multiplier for performing multiplication operations. Furthermore, the neuromorphic arithmetic device 100 may be configured to perform an addition operation for a plurality of multiplication operations. For example, the charging/discharging circuit 130 provided to the neuromorphic arithmetic device 100 may operate as an adder for performing an addition operation for multiplication operations.

The plurality of PWM converters 111 to 11$n$ may respectively receive a plurality of inputs INPUT1 to INPUTn to generate PWM signals PWM1 to PWMn. For example, the plurality of inputs INPUT1 to INPUTn may be binary values, and the plurality of PWM signals PWM1 to PWMn may correspond to the plurality of inputs INPUT1 to INPUTn respectively. That is, the PWM signals PWM1 to PWMn may have different pulse widths according to input values. Each of the PWM signals PWM1 to PWMn may have a high value at logic '1' of a binary input, and may have low value at logic '0' of a binary input. For example, the PWM converters 111 to 11$n$ may be enabled by a first enable signal EN1.

The plurality of synapse circuits 121 to 12$n$ may respectively receive the plurality of PWM signals PWM1 to PWMn. For example, circuits for respectively receiving the PWM signals PWM1 to PWMn may correspond to an axon of a nerve cell. The plurality of synapse circuits 121 to 12$n$ may respectively receive weights W1 to Wn. Alternatively, the weights W1 to Wn may be values respectively stored in the synapse circuits 121 to 12$n$. For example, the PWM signals PWM1 to PWMn may be a multiplicand that is a number to be multiplied. The weights W1 to Wn may be a multiplier that is a number for multiplying another number.

Each of the plurality of synapse circuits 121 to 12$n$ may be configured to perform a multiplication operation on a multiplicand (e.g., any one of the PWM signals PWM1 to PWMn) and a multiplier (e.g., any one of the weights W1 to Wn). Each of the plurality of synapse circuits 121 to 12$n$ may include a current source, a logic gate, and a switch to perform a multiplication operation. The plurality of synapse circuits 121 to 12$n$ may respectively output currents I1 to In as a result of a multiplication operation.

The charging/discharging circuit 130 may be configured to charge or discharge charges corresponding to a sum of the currents I1 to In. For example, the charging/discharging circuit 130 may correspond to a dendrite of a nerve cell. The charging/discharging circuit 130 may include a metal line having its own capacitance component to implement a dendrite. Alternatively, the charging/discharging circuit 130 may include an additional capacitor. Herein, it should be noted that the capacitor described as being included in the charging/discharging circuit 130 represents either a metal line having its own capacitance component and provided to implement a dendrite or a capacitor additionally provided.

The charging/discharging circuit 130 may receive charges from the current sources of the synapse circuits 121 to 12$n$ in a period during which the first enable signal EN1 is activated or a period during which a second enable signal EN2 is deactivated. For example, a time at which the charging/discharging circuit 130 receives charges from the current source of the synapse circuits 121 to 12$n$ corresponds to a period during which the PWM signals PWM1 to PWMn are generated by the PWM converters 111 to 11$n$, and the charging/discharging circuit 130 may not receive charges in a period during which the PWM signals PWM1 to PWMn are not generated.

Alternatively, the charging/discharging circuit 130 may be configured to be charged in a period during which the first enable signal EN1 is deactivated or a period during which the second enable signal EN2 is deactivated. The charging/discharging circuit 130 may be configured to discharge the charges stored therein in a period during which the second enable signal EN2 is activated.

The comparator 140 may compare a voltage level of a node N and a voltage level of a reference voltage Vref to generate a third enable signal EN3. For example, the comparator 140 may not operate in a period during which the second enable signal EN2 is deactivated. The comparator 140 may compare the voltage level of the node N with the level of the reference voltage Vref in a period during which the second enable signal EN2 is activated.

For example, in a period during which the second enable signal EN2 is activated, the currents I1 to In output from the synapse circuits 121 to 12n may be charged to a storage element of the charging/discharging circuit 130. Accordingly, the voltage of the node N would increase continuously. On the contrary, when the second enable signal EN2 is activated, the charging/discharging circuit 130 discharges stored charges, and thus the voltage of the node N would decrease. Here, the comparator 140 compares a decreasing voltage level of the node N and the level of the reference voltage Vref to generate the third enable signal EN3. For example, the comparator 140 may generate the third enable signal EN3 which is activated in a period during which the voltage level of the node N is higher than the level of the reference voltage Vref.

The counter 150 may count pulses output from an oscillator OSC in a period during which the third enable signal EN3 is activated. For example, the oscillator OSC and the counter 150 may be connected by a switch SW which is switched on by the third enable signal EN3. For example, when the oscillator OSC is connected to the counter 150 since the switch SW is switched on by the third enable signal EN3, the counter 150 may count the pulses (or clocks) output from the oscillator OSC, in synchronization with edges of the pulses (or clocks).

However, the configuration illustrated in FIG. 1 is exemplary, and thus various other configurations or logic elements may be applied, which are capable of generating an output signal OUTPUT by counting the pulses output from the oscillator OSC, in a period during which the third enable signal EN3 is activated.

According to the above-mentioned embodiment of the inventive concept, a series of procedures for performing multiplication operation and addition operations is performed according to operation of the PWM converters 111 to 11n, the synapse circuits 121 to 12n, the charging/discharging circuit 130, and the comparator 140 implemented with analog circuits, and a final addition operation result may be provided as a digital value on the basis of the signal (i.e., the third enable signal EN3) output from the comparator 140 and the pulses output from the oscillator OSC. Since most arithmetic operations are performed by analog circuits, a circuit structure may be simplified, and a chip size may be reduced.

Figure 2:
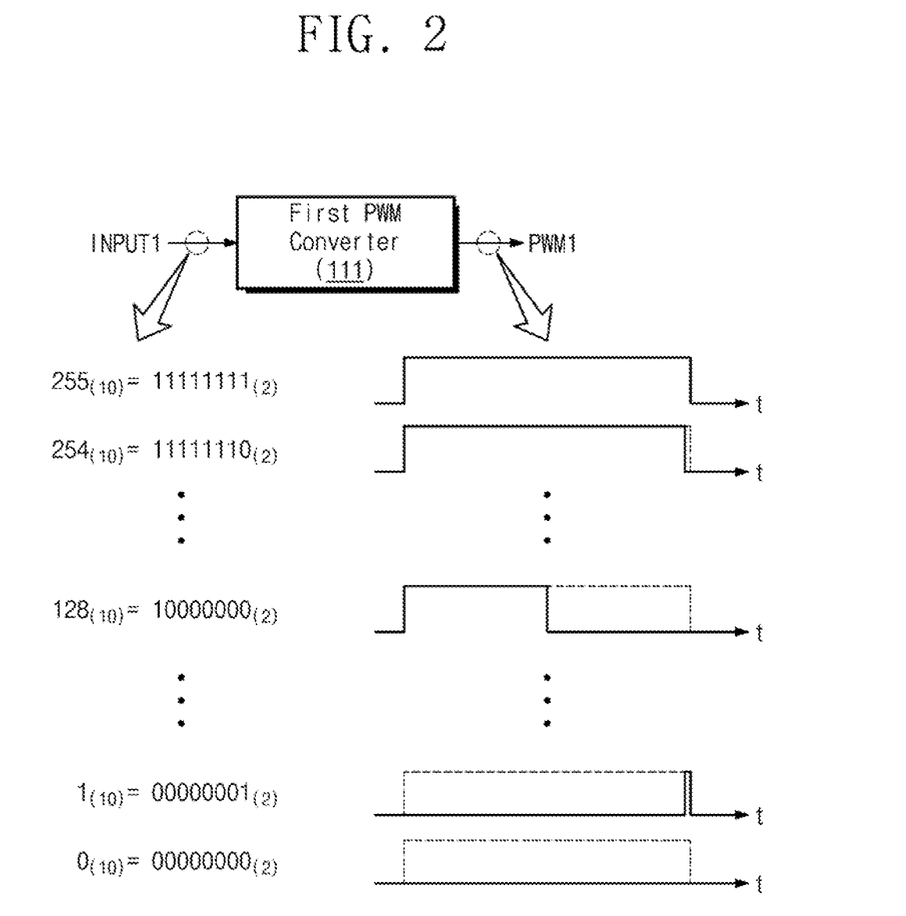
FIG. 2 is a diagram illustrating operation of the PWM converters illustrated in FIG. 1.

FIG. 2 is a diagram illustrating operation of the PWM converters illustrated in FIG. 1. Operation of the first PWM converter 111 amongst the plurality of converters 111 to 11n is exemplarily illustrated, and the structures and operation of the other converters 112 to 11n are substantially the same as those of the first PWM converter 111.

The first PWM converter 111 may receive the first input INPUT1 to generate the first PWM signal PWM1. The first input INPUT1 is exemplarily illustrated as an 8-bit binary number. Binary numbers input to the first PWM converter 111 and waveforms of PWM signals output from the first PWM converter 111 are exemplarily illustrated. For example, in a logic high period of a binary number input to the first PWM converter 111, bit '1' may be output, and in a logic low period of the binary number, bit '0' may be output.

Figure 3:
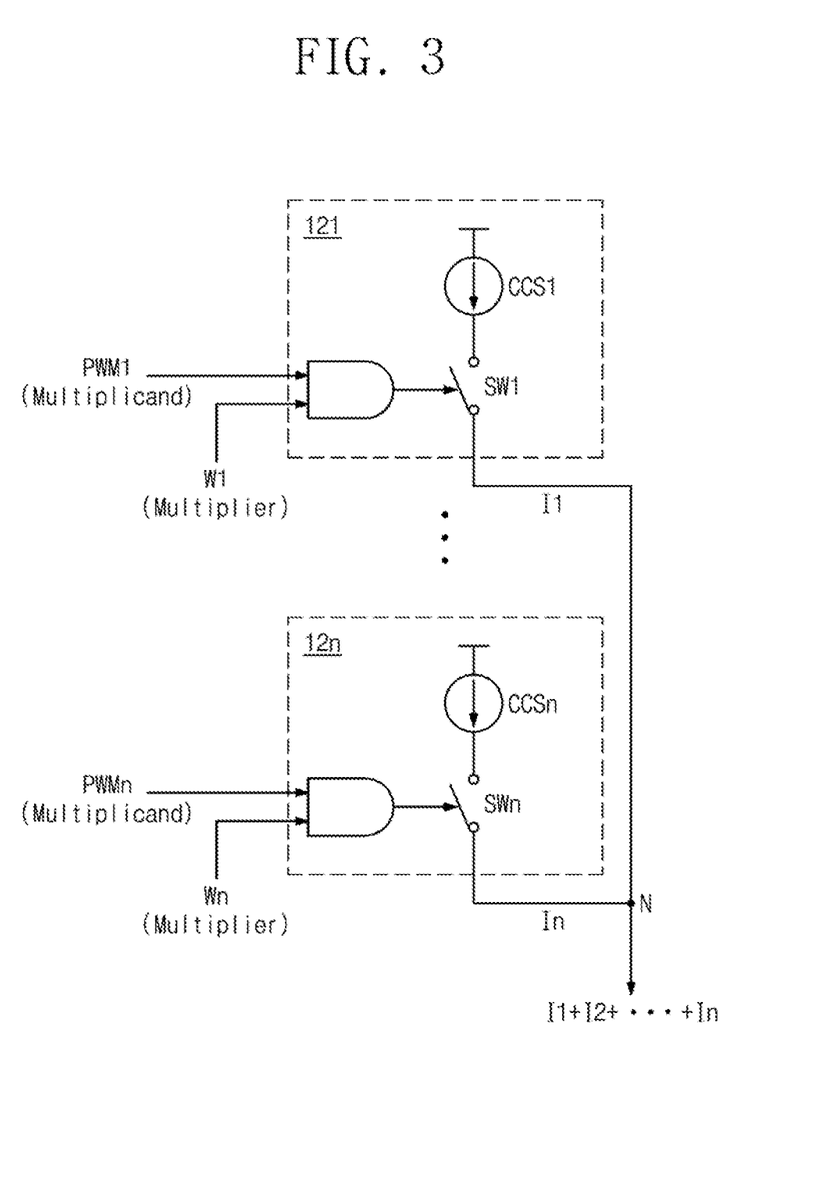
FIG. 3 is a diagram exemplarily illustrating the synapse circuits illustrated in FIG. 1.

FIG. 3 is a diagram exemplarily illustrating the synapse circuits illustrated in FIG. 1. For simplifying illustration, only the first and nth synapse circuits 121 and 12n amongst the synapse circuits 121 to 12n are illustrated. The first synapse circuit 121 may include an AND gate, a first charging current source CCS1, and a first switch SW1. The nth synapse circuit 121 may include an AND gate, an nth charging current source CCSn, and an nth switch SWn.

The AND gates of the synapse circuits 121 to 12n may respectively receive the PWM signals PWM1 to PWMn generated by the PWM converters 111 to 11n (see FIG. 1). For example, the PWM signals PWM1 to PWMn may be a multiplicand that is a number to be multiplied. The weights W1 to Wn may be respectively input to the AND gates of the synapse circuits 121 to 12n. For example, the weights W1 to Wn may be a multiplier that is a number for multiplying another number. For example, the weights W1 to Wn may be externally input, or may be stored in the synapse circuits 121 to 12n.

Each of the switches SW1 to SWn may be switched on or switched off according to a result of an operation performed by the AND gate provided to each of the synapse circuits 121 to 12n. For example, when the result of the operation performed by the AND gate is logic '1', the switch may be switched on, or when the result of the operation performed by the AND gate is logic '0', the switch may be switched off. As the switches SW1 to SWn are switched on, currents generated by the charging current sources CCS1 to CCSn may flow through the node N.

The charging current sources CCS1 to CCSn may be configured so that a voltage level induced by charges stored in a charging element (that may be provided in, for example, the charging/discharging circuit 130 of FIG. 1) increases linearly. In general, when a storage element such as a capacitor is charged, the level of a voltage on both ends of a capacitor increases exponentially. However, even though the currents generated by the charging current sources CCS1 to CCSn charge the charging/discharging circuit 130 (FIG. 1) through the nod N, a voltage level of the storage element (e.g., a capacitor or the like) of the charging/discharging circuit 130 (FIG. 1) or the node N may increase linearly.

According to the configuration illustrated in FIG. 3, addition operations for multiplication operations may be performed. For example, the first synapse circuit 121 may perform a first multiplication operation on the multiplier PWM1 and the multiplicand W1. Likewise, the nth synapse circuit 12n may perform an nth multiplication operation on the multiplier PWMn and the multiplicand Wn. Here, a result of the first multiplication may be indicated by the current I1, and a result of the nth multiplication operation may be indicated by the current In. As a result, a sum of the results of the first to nth multiplication operations may be indicated by a sum of the currents I1 to In.

If the linearity of the storage element (e.g., a capacitor or the like) of the charging/discharging circuit 130 (FIG. 1) is not guaranteed, the sum of the currents I1 to In may not indicate the sum of the results of the first to nth multiplication operations. However, since the charging current sources CSS1 to CCSn are configured so as to guarantee the linearity of the storage element (e.g., a capacitor or the like) of the charging/discharging circuit 130 (FIG. 1), the sum of the currents I1 to In may indicate the sum of the results of the first to nth multiplication operations.

Figure 4:
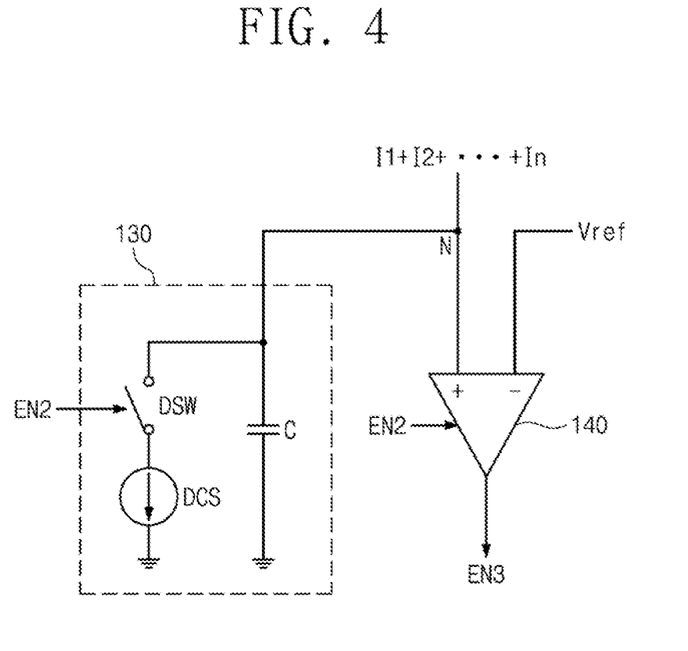
FIG. 4 is a block diagram exemplarily illustrating the charging/discharging circuit and the comparator illustrated in FIG. 1.

FIG. 4 is a block diagram exemplarily illustrating the charging/discharging circuit 130 and the comparator 140 illustrated in FIG. 1.

The charging/discharging circuit 130 may be configured to charge charges corresponding to the current I1 to In or discharge charged charges in response to the second enable signal EN2. The charging/discharging circuit 130 is exemplarily illustrated as including a capacitor C, a discharging current source DCS, and a discharging switch DSW. However, the charging/discharging circuit 130 may be variously configured so as to charge or discharge in response to the second enable signal EN2. For example, not only the discharging current source DCS and the capacitor C but also other various active elements and passive elements may be adopted.

The discharging current source DCS assists with a linear decrease of the voltage level of the node N when the charging/discharging circuit 130 discharges. In general, when a capacitor is discharged, charges stored in the capacitor decreases exponentially. However, the linearity is required to be guaranteed to perform an addition operation for a plurality of multiplication operations. Therefore, the discharging current source DCS is provided to linearly decrease the voltage level of the node N at the time of discharging.

The comparator 140 may compare the voltage level of the node N and the level of the reference voltage Vref, and may output the third enable signal EN3 according to a result of the comparison. For example, the comparator 140 may output the third enable signal EN3 only when the voltage level of the node N is higher than the level of the reference voltage Vref. The comparator 140 may be configured as an operational amplifier or a differential amplifier, but is not limited thereto. For example, the comparator 140 may be variously implemented so as to output the third enable signal EN3 according to a result of comparison between two voltage levels.

Figure 5A:
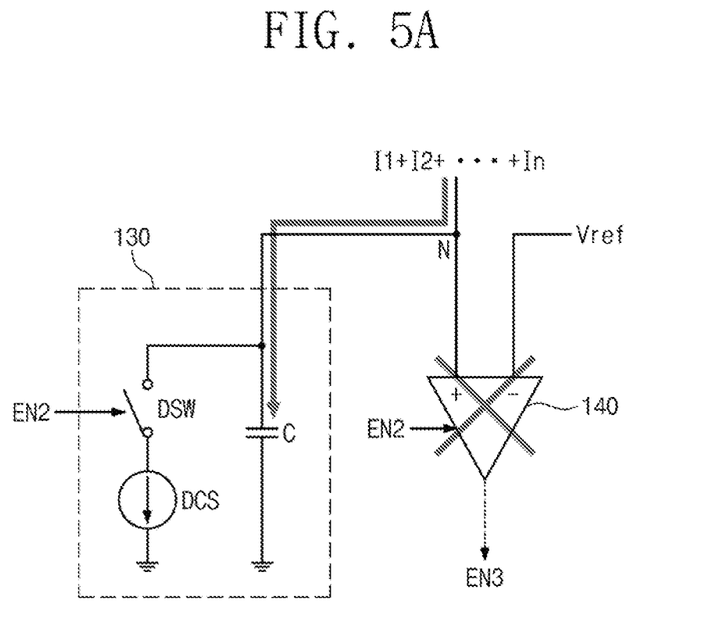
FIG. 5A is a diagram illustrating a charging operation of the charging/discharging circuit illustrated in FIG. 4.

FIG. 5A is a diagram illustrating a charging operation of the charging/discharging circuit 130 illustrated in FIG. 4.

When charging the charging/discharging circuit 130, the second enable signal EN2 is deactivated. Therefore, charges of the currents I1 to In flowing through the node N may be stored in the capacitor. As the capacitor C is charged, the voltage level of the node N may increase linearly. This is because the currents I1 to In are based on the charging current sources CCS1 to CCSn having linearity. Meanwhile, since the second enable signal EN2 is deactivated, the comparator 140 does not operate. Accordingly, the third enable signal EN3 is not output.

Figure 5B:
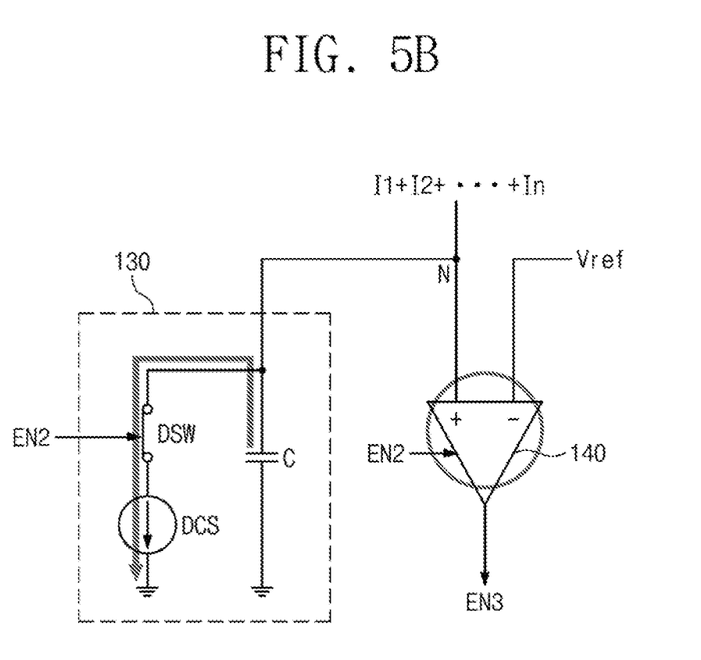
FIG. 5B is a diagram illustrating a discharging operation of the charging/discharging circuit illustrated in FIG. 4.

FIG. 5B is a diagram illustrating a discharging operation of the charging/discharging circuit 130 illustrated in FIG. 4.

When discharging the charging/discharging circuit 130, the second enable signal EN2 is activated. Since the discharging switch DSW is switched on by the second enable signal EN2, the capacitor C is grounded through the discharging current source DCS. Here, due to the discharging current source DCS having linearity, the voltage level of the node N may decrease linearly.

Meanwhile, since the second enable signal EN2 is activated, the comparator 140 may perform a comparison operation. The comparator 140 may compare the voltage level of the node N and the level of the reference voltage Vref, and may generate the third enable signal EN3 which is activated in a period during which the voltage level of the node N is higher than the level of the reference voltage Vref.

Figure 6:
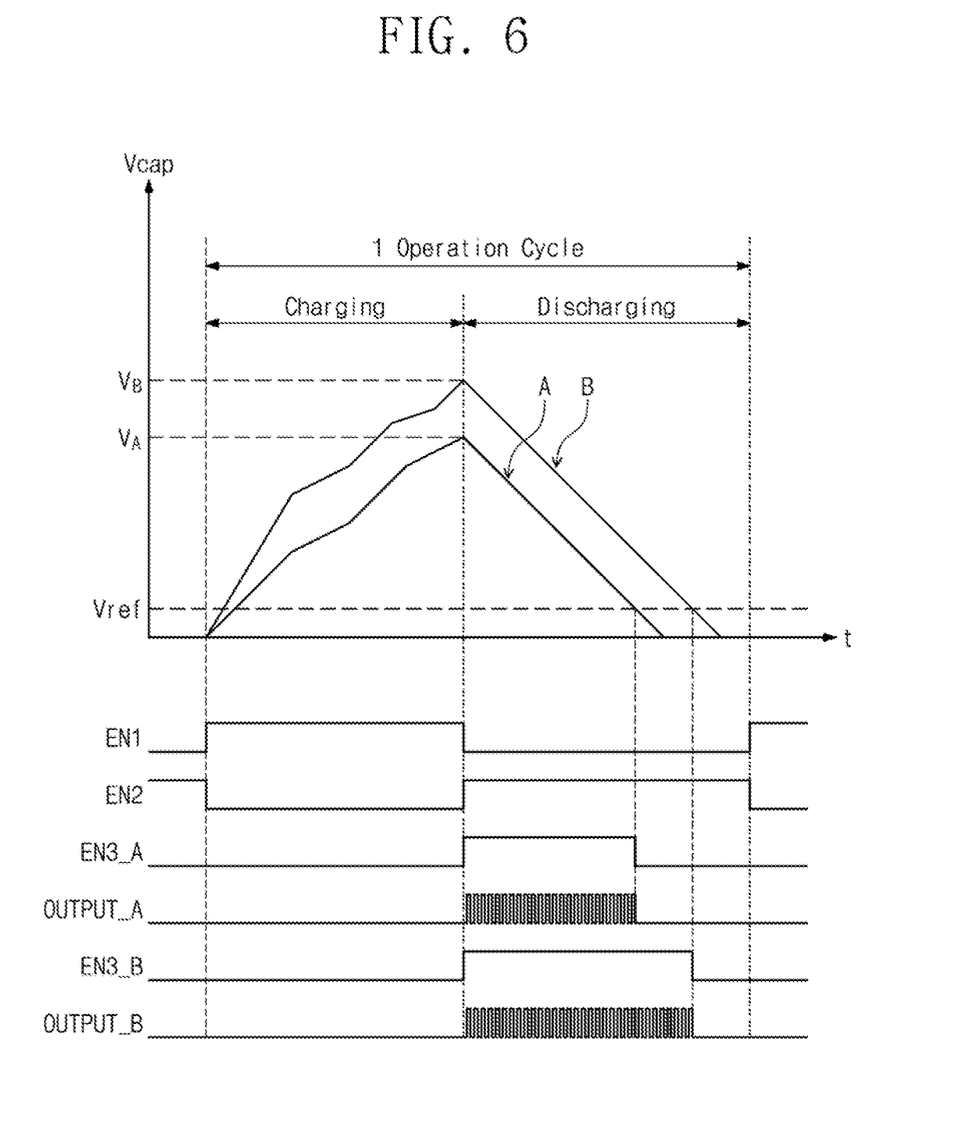
FIG. 6 is a graph illustrating operation of the charging/discharging circuit and the comparator illustrated in FIGS. 5A and 5B.

FIG. 6 is a graph illustrating operation of the charging/discharging circuit 130 and the comparator 140 illustrated in FIGS. 5A and 5B. The horizontal axis of the graph represents a time, and the vertical axis represents the voltage level of the capacitor C (or the node N). 1 arithmetic cycle may include a charging period and a discharging period. The following description is provided with reference to FIGS. 1, 3, 5A, and 5B also to assist with an understanding.

In the charging period, the first enable signal EN1 is activated, and the second enable signal EN2 and the third enable signals EN3_A and EN3_B are deactivated. That is, in the charging period, only the multiplication operation of the synapse circuits 121 to 12n and the addition operation of the charging/discharging circuit 130 are performed. On the contrary, discharging of the charging/discharging circuit 130 does not occur, and the comparator 140 does not operate.

The charging period may indicate a procedure of the multiplication operations of the synapse circuits 121 to 12n and a procedure of adding the results of the multiplication operations. As described above with reference to FIGS. 5A and 5B, since a voltage level Vcap of a capacitor increases linearly in the charging period, the sum of the currents I1 to In flowing through the node N may indicate the sum of the results of the multiplication operations. This linearity may be secured by the charging current sources CCS1 to CCSn respectively provided to the synapse circuits 121 to 12n.

If the sum of the results of the multiplication operations is relatively large, the voltage level (e.g., $V_A$) of the capacitor C (or the node N) may be relatively large. In this case, the result of the addition operation may correspond to line A of the graph. On the contrary, if the sum of the multiplication operations is relatively small, the voltage level (e.g., $V_B$) of the capacitor C (or the node N) may be relatively small. In this case, the result of the addition operation may correspond to line B of the graph.

In the discharging period, the first enable signal EN1 is deactivated, and the second enable signal EN2 and the third enable signals EN3_A and EN3_B are activated. Activation of the second enable signal EN2 represents discharging of the charging/discharging circuit 130. However, the third enable signals EN3_A and EN3_B are not always activated in the discharging period. That is, the third enable signals EN3_A and EN3_B are activated only in a period during which the voltage level of the capacitor C (or the voltage level of the node N) is higher than the reference voltage Vref.

In the discharging period, a process for digitizing an addition result represented by a charge amount stored in the capacitor C may be performed. As described above with reference to FIGS. 5A and 5B, the voltage level Vcap of the capacitor decreases linearly in the discharging period. This linearity may be secured by the discharging current source DCS provided to the charging/discharging circuit 130.

If the sum of the results of the multiplication operations is relatively large, a period during which the voltage level of the capacitor C (or the node N) is higher than the reference voltage Vref may be relatively long. On the contrary, if the sum of the results of the multiplication operations is relatively small, a period during which the voltage level of the capacitor C (or the node N) is higher than the reference voltage Vref may be relatively short.

In the discharging period, while the third enable signals EN3_A and EN3_B are activated, the counter 150 connected to an output terminal of the comparator 140 may count the output pulses of the oscillator OSC. A counting result (i.e., the output signal OUTPUT) may be appropriately shifted (by, for example, a level shifter or the like) so as to be used for a desired purpose.

According to the above-mentioned configuration, an addition operation for a plurality of multiplication operations may be performed using an analog circuit configured with relatively simple elements such as the discharging switch DSW, the discharging current source DCS, the capacitor C, and the comparator 140, and an operation result may be represented by a digital value through a counter. Therefore, the structure of the circuit may be simplified, and a manufacturing cost may be reduced. Furthermore, since the linearity of charging and discharging of the charging/discharging circuit 130 is guaranteed, the result of the addition operation for the multiplication operations may be accurately digitized.

Figure 7:
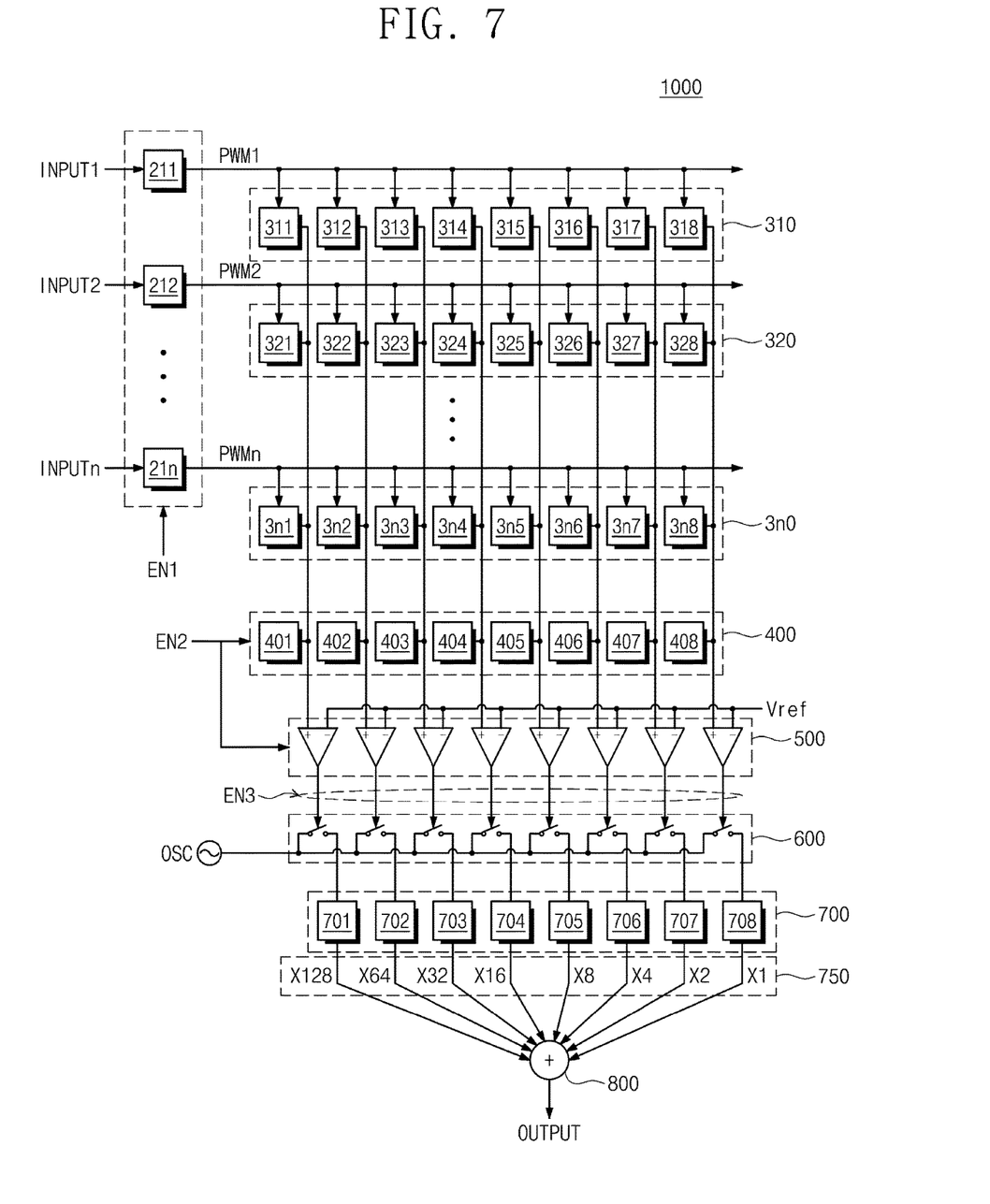
FIG. 7 is a block diagram illustrating a neuromorphic arithmetic device according to an embodiment of the inventive concept.

FIG. 7 is a block diagram illustrating a neuromorphic arithmetic device according to an embodiment of the inventive concept. A neuromorphic arithmetic device 1000 may include PWM converters 211 to 21n, synapse circuits 311 to 318, 321 to 328, . . . , 3n1 to 3n8, charging/discharging circuits 401 to 408, comparators 501 to 508, an oscillator OSC, a switching circuit 600, counters 701 to 708, and an adder 800.

The structure of the neuromorphic arithmetic device 1000 may be similar to that of the neuromorphic arithmetic device described above with reference to FIGS. 1 to 6. However, the synapse circuits are arranged in a matrix form along rows and columns. Furthermore, a charging/discharging circuit, a comparator, a switch, and a counter are arranged for each row.

Each of the PWM converters 211 to 21n may be arranged for each of the rows of the synapse circuits 311 to 318, 321 to 328, . . . , 3n1 to 3n8. For example, the first PWM converter 211 may be connected to the synapse circuits 310. The second PWM converter 212 may be connected to the synapse circuits 320. The other PWM converters may be arranged in this manner.

The PWM converters 211 to 21n may respectively receive a plurality of inputs INPUT1 to INPUTn to generate PWM signals PWM1 to PWMn. The plurality of inputs INPUT1 to INPUTn may be binary values, and the PWM signals PWM1 to PWMn may have different pulse widths corresponding to the inputs INPUT1 to INPUTn respectively. The PWM converters 211 to 21n may be enabled by a first enable signal EN1.

The synapse circuits 311 to 318, 321 to 328, . . . , 3n1 to 3n8 may be arranged in a matrix form along rows and columns. For example, the synapse circuits 310 may be arranged along a first row, and the synapse circuits 320 may be arranged along a second row. The other synapse circuits are arranged in this manner. The synapse circuits are exemplarily illustrated as being arranged along n number of rows and eight columns, but are not limited thereto.

The synapse circuits 311 to 318 arranged along the first row may be configured to perform a first multiplication operation on a first multiplicand and a first multiplier. For example, each of the synapse circuits 311 to 318 may receive the first PWM signal PWM1 as the first multiplicand.

The synapse circuits 311 to 318 may receive the first multiplier. Alternatively, the first multiplier may be pre-stored in each synapse circuit. However, each synapse circuit may receive only one bit of the first multiplier. For example, provided that the first multiplier is an 8-bit binary input, the synapse circuit 311 may store a most significant bit (MSB) of the first multiplier, and the synapse circuit 318 may store a least significant bit (LSB) of the first multiplier. The synapse circuits 312 to 317 may sequentially store the other bits between the MSB and the LSB of the first multiplier.

Each of the synapse circuits 311 to 318 may perform a partial product on the first PWM signal PWM1, which is the first multiplicand, and the first multiplier. For example, the synapse circuit 311 may perform a multiplication operation on the first PWM signal PWM1 and the MSB of the first multiplier. The synapse circuit 318 may perform a multiplication operation on the first PWM signal PWM1 and the LSB of the first multiplier. The other synapse circuits 312 to 317 may perform a multiplication operation on the first PWM signal PWM1 and the other bits of the first multiplier.

A result of the multiplication operation performed by each of the synapse circuits 311 to 318 may be represented by a current output from each synapse circuit as described above with reference to FIGS. 1 to 6. That is, results of the first multiplication operation performed by the synapse circuits 311 to 318 may be stored in the charging/discharging circuits 401 to 408 respectively.

The synapse circuits 321 to 328 arranged along the second row may be configured to perform a second multiplication operation on a second multiplicand and a second multiplier. For example, each of the synapse circuits 321 to 328 may receive the second PWM signal PWM2 as the second multiplicand. In a similar manner to that described above, each of the synapse circuits 321 to 328 may receive one of bits constituting the second multiplier. A result of a partial product between the second multiplicand and the second multiplier performed by each of the synapse circuits 321 to 328 may be represented by a current output from each synapse circuit, and may be stored in each of the charging/discharging circuits 401 to 408.

Since the result of the second multiplication operation performed by the synapse circuits 321 to 328 is added to the charging/discharging circuits 401 to 408 in addition to the result of the first multiplication operation performed by the synapse circuits 311 to 318, an addition operation is performed by the charging/discharging circuits 401 to 408.

In this manner, the other synapse circuits may perform a partial product, and a result thereof may be stored in the charging/discharging circuits 401 to 408.

Thereafter, at the time of discharging, a discharging operation of the charging/discharging circuits 401 to 408, a voltage comparison operation of the comparators 500, and a counting operation of the counters 700 due to switching-on of the switching circuit 600 are performed. These operations are similar to the operations described above with reference to FIGS. 1 to 6.

After the results of the multiplication operations performed by the synapse circuits 311 to 318, 321 to 328, . . . , 3n1 to 3n8 are accumulated in the charging/discharging circuits 401 to 408, the first enable signal EN1 may be deactivated. Furthermore, the second enable signal EN2 may be activated so that discharging may occur in the charging/discharging circuits 401 to 408. The voltage levels of the capacitors provided to the charging/discharging circuits 401 to 408 may decrease linearly as illustrated in FIG. 6. This linearity is caused by the discharging current sources provided to the charging/discharging circuits 401 to 408.

Simultaneously with the discharging of the charging/discharging circuits 401 to 408, the comparators 500 are enabled by the second enable signal EN2. As a result, the voltage level on both ends of the capacitor provided to each of the charging/discharging circuits 401 to 408 may be compared with the level of a reference voltage Vref. The comparators 500 may generate third enable signals EN3 which are activated in a period during which the voltage level on both ends of the capacitor provided to each of the charging/discharging circuits 401 to 408 is higher than the level of the reference voltage Vref.

Each switch constituting the switching circuit 600 may be switched on in a period during which the third enable signals EN3 are activated. Here, the pulses (or clocks) output from the oscillator OSC may be input to the counters 701 to 708 so as to be counted by the counters 701 to 708. Results of counting by the counters 701 to 708 may be output as digital values.

However, the digital values output from the counters 701 to 708 have been obtained without considering an order number of a bit for a partial product that has been performed on a multiplier and a multiplicand. Therefore, appropriate shifting (or level shifting) is required to be performed on the digital values output from the counters 701 to 708 in order to obtain a complete operation result.

For example, the digital value output from the counter 701 is a sum of results of partial products of MSBs of multipliers and multiplicands. Therefore, the digital value output from the counter 701 is required to be multiplied by $2^7$ (i.e., 128). For example, the digital value output from the counter 708 is a sum of results of partial products of LSBs of multipliers and multiplicands. Therefore, the digital value output from the counter 708 is required to be multiplied by $2^0$ (i.e., 1). The digital values output from the other counters 702 to 707 are also required to be shifted in this manner. This shifting may be performed by, for example, a level shifter 750.

The adder 800 may add shifted digital values, and may output an addition result OUTPUT. The adder 800 may be configured with various logic elements capable of adding a plurality of digital values and outputting a result of the addition.

According to the above-mentioned configuration, a neuromorphic arithmetic device may be implemented using an analog circuit configured with relatively simple elements such as the charging/discharging circuits 400 including a discharging switch, a discharging current source, and a capacitor, the comparators 500, the switching circuit 600, and the counters 700. Therefore, the structure of the circuit may be simplified, and a manufacturing cost may be reduced. Furthermore, since the linearity of charging and discharging of the charging/discharging circuit 400 is guaranteed, the result of the addition operation for the multiplication operations may be accurately obtained.

According to embodiments of the inventive concept, various operations are performed in an analog manner using a charging/discharging circuit provided to a neuromorphic arithmetic device. Therefore, since it is not necessary to oscillate a dendrite capacitor every time, power consumption may be reduced.

Furthermore, according to embodiments of the inventive concept, since a neuromorphic arithmetic device is implemented using analog elements, a chip size and a manufacturing cost may be reduced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A neuromorphic arithmetic device comprising:
    a first synapse circuit configured to generate a first current by performing a first multiplication operation on a first pulse width modulation (PWM) signal and a first weight;
    a second synapse circuit configured to generate a second current by performing a second multiplication operation on a second PWM signal and a second weight;
    a charging/discharging circuit configured to store charges induced by the first current and the second current in a charging period, and discharge the charges in a discharging period;
    a comparator configured to compare a voltage level of the charges discharged in the discharging period and a level of a reference voltage and output an enable signal which is activated in a period during which the voltage level of the discharged charges is higher than the reference voltage; and
    a counter configured to count output pulses of an oscillator on the basis of a result of the comparison by the comparator.

2. The neuromorphic arithmetic device of claim 1, further comprising:
    a first PWM converter configured to convert a first input into the first PWM signal; and
    a second PWM converter configured to convert a second input into the second PWM signal.

3. The neuromorphic arithmetic device of claim 1, wherein the first synapse circuit comprises:
    a first AND gate configured to perform an AND operation on the first PWM signal and the first weight; and
    a first charging current source configured to generate the first current according to an output from the first AND gate, and
    wherein the second synapse circuit comprises:
    a second AND gate configured to perform an AND operation on the second PWM signal and the second weight; and
    a second charging current source configured to generate the second current according to an output from the second AND gate.

4. The neuromorphic arithmetic device of claim 3, wherein the first charging current is configured so that a voltage level of the charging/discharging circuit induced by the first current increases linearly, and
    wherein the second charging current is configured so that a voltage level of the charging/discharging circuit induced by the second current increases linearly.

5. The neuromorphic arithmetic device of claim 1, wherein the charging/discharging circuit comprises:
    a capacitor configured to store the charges in the charging period; and
    a discharging current source configured to linearly decrease a voltage level of the capacitor induced by the charges in the discharging period.

6. The neuromorphic arithmetic device of claim 1, wherein the comparator is a differential amplifier operating in a period during which the charging/discharging circuit is discharged.

7. The neuromorphic arithmetic device of claim 6, wherein the counter counts the output pulses of the oscillator in a period during which the enable signal is activated.

8. The neuromorphic arithmetic device of claim 7, further comprising a switch configured to be switched on in response to activation of the enable signal to connect the oscillator to the counter.

9. The neuromorphic arithmetic device of claim 7, further comprising a switch disposed between the oscillator and the counter and receiving the enable signal, the switch transmitting the output pulses of the oscillator to the counter in the period during which the voltage level of the discharged charges is higher than the reference voltage.

10. The neuromorphic arithmetic device of claim 1, wherein the first synapse circuit and the second synapse circuit share the oscillator that is a global oscillator.

11. The neuromorphic arithmetic device of claim 1, wherein the counter counts a number of the output pulses of the oscillator in the period during which the voltage level of the discharged charges is higher than the reference voltage.

12. A neuromorphic arithmetic device comprising:
- a first synapse circuit configured to generate a first current by performing a first multiplication operation on a first pulse width modulation (PWM) signal and a first weight;
- a second synapse circuit configured to generate a second current by performing a second multiplication operation on a second PWM signal and a second weight;
- a charging/discharging circuit configured to store charges induced by the first current and the second current in a charging period, and discharge the charges in a discharging period;
- a comparator configured to compare a voltage level of the charges discharged in the discharging period and a level of a reference voltage;
- a counter configured to count output pulses of an oscillator on the basis of a result of the comparison by the comparator; and
- a level shifter configured to shift a digital value output from the counter.

* * * * *